(12) United States Patent
Campiano et al.

(10) Patent No.: US 10,925,192 B1
(45) Date of Patent: Feb. 16, 2021

(54) USING PREDICTIVE ANALYTICS IN ELECTROCHEMICAL AND ELECTROMECHANICAL SYSTEMS

(71) Applicant: Modius Inc., Los Altos, CA (US)

(72) Inventors: Craig Campiano, Oakland, CA (US); Steven De Gryze, San Francisco, CA (US); Rosa Catala-Luque, San Francisco, CA (US)

(73) Assignee: Modius Inc., San Francisco, CA (US)

( * ) Notice: Subject to any disclaimer, the term of this patent is extended or adjusted under 35 U.S.C. 154(b) by 19 days.

(21) Appl. No.: 16/159,694

(22) Filed: Oct. 14, 2018

(51) Int. Cl.
| | | |
|---|---|---|
| *H05K 7/20* | (2006.01) | |
| *G06N 7/00* | (2006.01) | |
| *G05B 13/04* | (2006.01) | |
| *G06N 20/00* | (2019.01) | |
| *G06F 9/50* | (2006.01) | |
| *G06K 9/62* | (2006.01) | |
| *G05B 13/02* | (2006.01) | |
| *G06F 16/907* | (2019.01) | |

(52) U.S. Cl.
CPC ..... *H05K 7/20836* (2013.01); *G05B 13/0265* (2013.01); *G05B 13/047* (2013.01); *G05B 13/048* (2013.01); *G06F 9/5088* (2013.01); *G06K 9/6257* (2013.01); *G06N 7/005* (2013.01); *G06N 20/00* (2019.01); *G06F 16/907* (2019.01)

(58) Field of Classification Search
None
See application file for complete search history.

(56) References Cited

U.S. PATENT DOCUMENTS

| | | | | |
|---|---|---|---|---|
| 7,620,613 | B1 * | 11/2009 | Moore | H05K 7/20836 |
| | | | | 700/28 |
| 2004/0065097 | A1 * | 4/2004 | Bash | H05K 7/20836 |
| | | | | 62/180 |
| 2011/0106314 | A1 * | 5/2011 | Beitelmal | H05K 7/20836 |
| | | | | 700/276 |
| 2012/0197444 | A1 * | 8/2012 | Wang | H05K 7/20836 |
| | | | | 700/276 |
| 2018/0283811 | A1 * | 10/2018 | Victor | F28F 27/00 |

\* cited by examiner

*Primary Examiner* — Ryan A Jarrett

(57) ABSTRACT

Machine learning techniques provide predictions of computer system load and cooling requirements, allowing cooling systems to anticipate, prepare for, and ameliorate, those requirements. Techniques provide confirmation or denial that the computer and cooling systems are operating as expected, allowing those systems to determine if any parts are failing. Techniques provide information regarding likely effect due to proposed changes. Techniques provide probabilistic predictions, well in advance, of whether parts will fail or degrade. Techniques provide probabilistic predictions whether parts will fail or degrade, responsive to degrees of redundancy, set points for of cooling, or set points when cooling starts or ends.

17 Claims, 2 Drawing Sheets

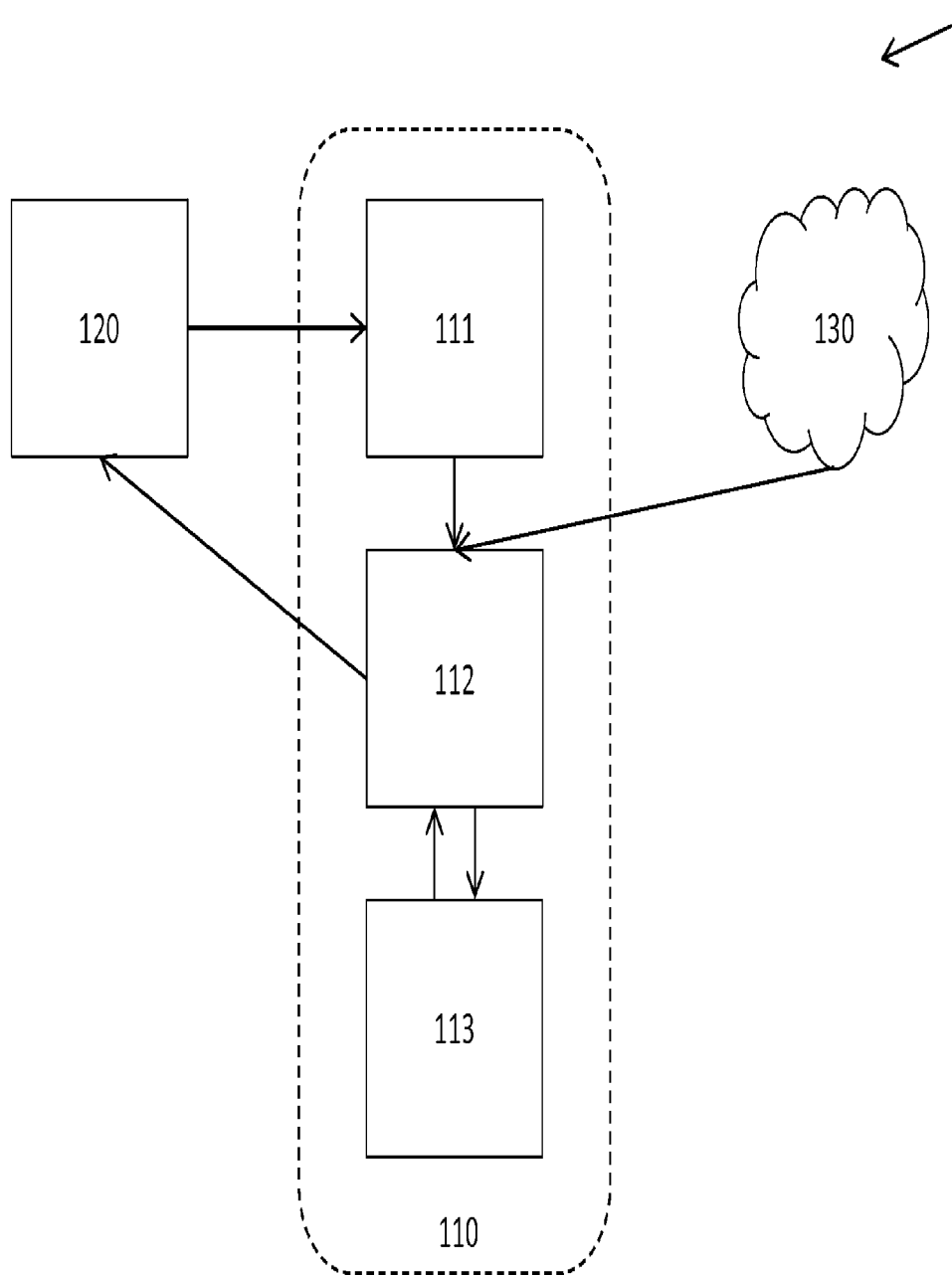

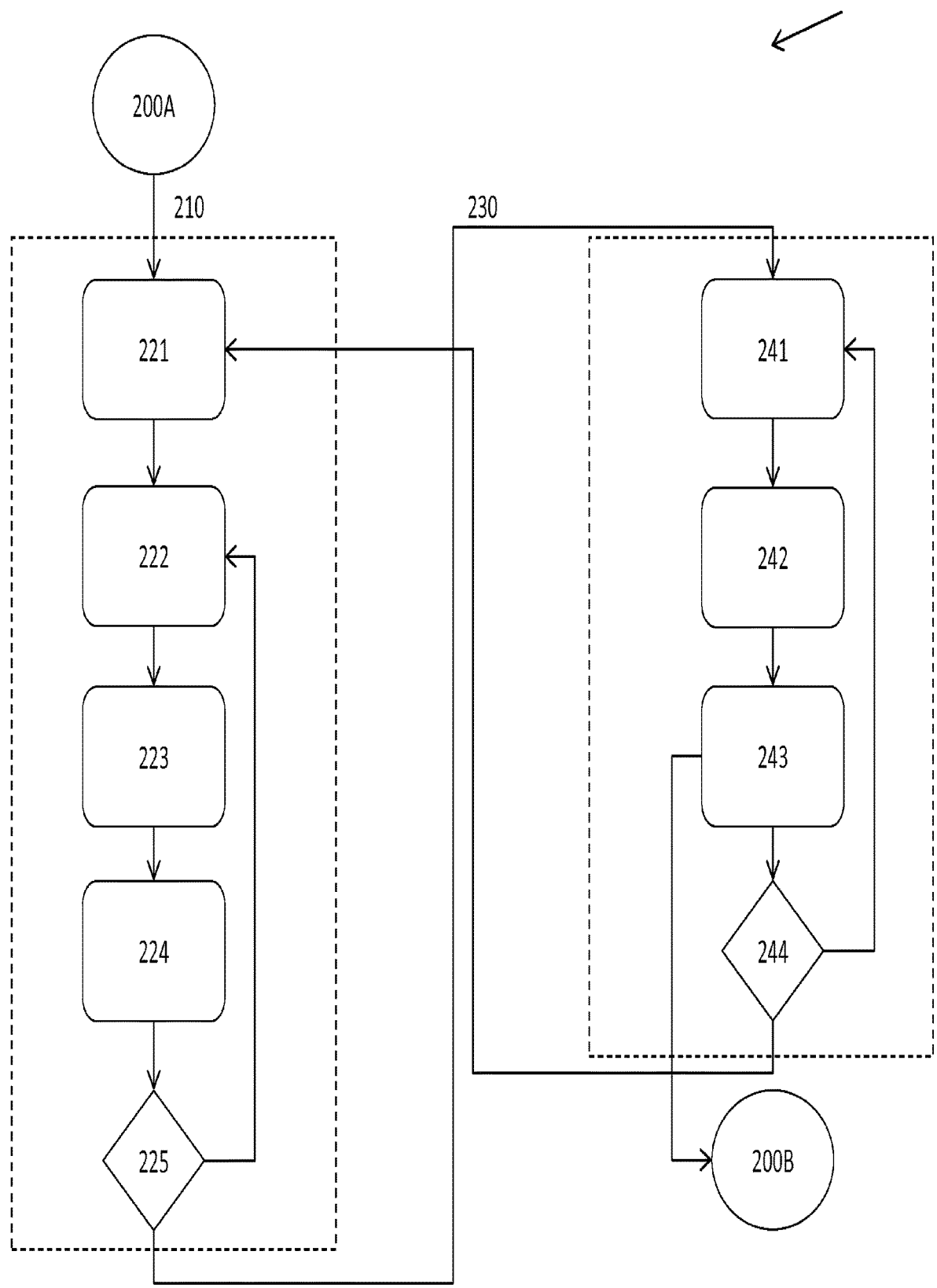

USING PREDICTIVE ANALYTICS IN ELECTROCHEMICAL AND ELECTROMECHANICAL SYSTEMS

BACKGROUND

Field of the Disclosure

This application generally relates to using predictive analytics in electrochemical and electromechanical systems, and other matters.

Background of the Disclosure

Known electrochemical and electromechanical systems can operate in environments in which multiple factors can affect performance. For example, electrochemical and electromechanical systems can require frequent measurement of airflow, cooling effect, humidity, temperature, and combinations or conjunctions thereof. Such systems can also require frequent adjustment of input controls, such as assignment of airflow and liquid cooling effects, assignment of computer processing load, assignment of temperature cooling effect, and combinations or conjunctions thereof, to operate properly or at peak efficiency.

For a first example, computing systems and other electrical systems that produce heat can require significant cooling efforts to maintain operations. Computing systems that operate at too hot a temperature can risk damage to the computing system, can risk erroneous results produced by the computing system, can risk weakening of parts or other lifetime-reducing effects, or some combination or conjunction thereof. Excess heat can be generated when computing systems operate continuously without substantially ever going into any power-saving or standby mode, when computing systems are overclocked, when computing systems are operating peripherals at more-than-average rates, and combinations or conjunctions thereof. Excess heat can also be generated when cooling equipment operates in an inefficient environment, such as when there is inadequate venting, or when the ambient weather is excessively warm or humid.

For a second example, controlled chemical, electrochemical, and electromechanical systems that operate differently at distinct temperatures or power levels can require significant efforts to actively manage their operating parameters, to maintain operating efficacy and efficiency. Chemical processes such as refineries that operate at improper pressure or temperature can risk weakening of parts and even explosive decompression if operated improperly. Similarly, electrochemical systems such as automobile engines that operate at improper pressure or temperature can risk damage to the chemical operating portions of the engine (such as combustion chambers, fuel valves, and otherwise), can risk damage to the mechanical operating portions of the engine (such as pistons, transmissions, and otherwise), can risk weakening of parts or other lifetime-reducing effects, or some combination or conjunction thereof.

Some Drawbacks of the Known Art.

Each of these issues, as well as other possible considerations, might cause difficulty in aspects of operating electrochemical and electromechanical systems, particularly those involving heating or cooling of electrical equipment, such as computing systems. Known control and monitoring systems make use of absolute or relative measurements and differences, in response to pre-defined logic and process criteria, with the effect that such systems can be reactive to in-process events, or based on possibly-improper theoretical input values. Moreover, known systems often involve significant customization for each installation, in response to non-standard and unstructured nature of measurement schemas often found in electrochemical or electromechanical environments.

BRIEF SUMMARY OF THE DISCLOSURE

This application provides systems and techniques (including machines, methods, articles of manufacture, and products maintaining computing instructions) that can assist one or more users with improving the efficacy and efficiency of control systems or regimes for electrochemical and electromechanical systems, particularly including cooling systems directed to computer system equipment.

Possible Systems for Predictive Analysis

One or more machine learning (ML) techniques provide users with predictions of likely computer system load and cooling requirements (sometimes referred to as performance forecasting), allowing cooling systems to anticipate those requirements, prepare for those requirements, ameliorate those requirements, and combinations or conjunctions thereof. For example, the cooling system can be started earlier in the morning on days for which the systems or techniques predict unusually warm weather.

One or more systems or techniques can also provide users with confirmation or denial that the computer system and cooling system are operating as expected (sometimes referred to as anomaly detection), allowing the computer system and cooling system to determine if any control elements or parts are deviating from expectations, in whole or in part, or if the predictive model is deviating from expectations (such as if present measurements are not in accord with past events). This could result from undocumented or otherwise unexpected changes in the system.

One or more systems or techniques can also provide users with information with respect to a likely degree of effect on the computer system, in response to proposed changes to the cooling system, or in response to proposed changes to interactions between the computer system and the cooling system (sometimes referred to as scenario analysis). For example, an increase in cooling capacity can reduce the risk of overheating the computer system, at increased monetary expense and reduced efficiency of the cooling system, while a decrease in cooling capacity can reduce monetary expense and increase efficiency, at increased risk of overheating. Similarly, one or more systems or techniques could also provide users with predictions of probabilities that control elements, sensors, or other parts, will fail to operate, or will operate only in a degraded manner, in response to users determining a degree of redundancy with respect to parts or subsystems; in response to users determining one or more set points, for an amount of cooling, or in response to users determining one or more set points at which cooling starts or ends; and combinations or conjunctions thereof. For example, a cooling system that is set to begin cooling at 4 degrees Celsius below an overheated set point could have a lesser risk of failure than a cooling system that is set to begin cooling at 3 degrees Celsius below that set point, but at the expense of greater energy use in the process of cooling, and possibly at the expense of involving a stronger cooling device.

One or more systems or techniques can also provide users with predictions of probabilities that control elements, sensors or other parts, will fail to operate, or will operate only in a degraded manner, in response to users determining a degree of redundancy with respect to parts or subsystems; in response to users determining one or more set points, for an amount of cooling, or in response to users determining one or more set points at which cooling starts or ends; and combinations or conjunctions thereof. For example, a cooling system that is set to begin cooling at 4 degrees Celsius below an overheated set point could have a lesser risk of failure than a cooling system that is set to begin cooling at 3 degrees Celsius below that set point, but at the expense of greater energy use in the process of cooling, and possibly at the expense of involving a stronger cooling device.

One or more systems or techniques can also provide users with predictions of probabilities that control elements or parts will fail to operate, or operate only in a degraded manner (sometimes referred to as event prediction or failure prediction), in whole or in part, well in advance of such incidents. For example, a power system rated to provide 700 KW of power can result in failure of the computer system with a probability distribution related to the amount of power drawn by that computer system. For example, failure of the cooling system to have the effect expected for its settings can indicate a part failure, an impending part failure, or a sensor failure (sometimes referred to as failure analysis).

Possible Uses of Predictive Analysis

In one or more first examples related to techniques described above with respect to performance forecasting, the predictive information provided to users can allow one or more of those users to take action to reduce risks associated with excessive heat, inadequate cooling, or a combination thereof. The user can reduce the amount of heat generated by the computer system, such as by reducing its clock speed, reducing its use of peripheral devices, reducing the amount of capacity demanded from the computer system, and combinations or conjunctions thereof. The user can also increase the amount of cooling generated by the cooling system, such as by increasing the amount of airflow, increasing the amount of fan speed, increasing the amount of cooling capacity devoted to the computer system (such as by increasing the number of cooling units that are turned on in or adjacent to the room including computing system, and combinations or conjunctions thereof.

In one or more second examples related to techniques described above with respect to performance forecasting, the predictive information can allow cooling systems to prepare for predicted additional computer system use (and associated heat generation), such as by pre-cooling computer system equipment, with the effect that cooling efforts at peak load can be reduced, at least relative to a maximum acceptable heat load. In such second examples, cooling systems can also ameliorate predicted imbalanced computer system use by reassigning computer system tasks to load-balance demand on cooling equipment. Such load-balancing can occur by transferring predicted (or otherwise likely) computer system tasks from peak-demand times to lesser-demand times, by transferring predicted or likely computer system tasks from concentration in a single server to distribution among multiple servers, from concentration in a single server center to distribution among multiple server centers, and by combinations or conjunctions thereof.

In one or more third examples related to techniques described above with respect to anomaly detection, the predictive information can be compared with actual sensor results from the computer system (such as computing capacity, heat generation, and power usage) and the cooling system (such as heat reduction, number of cooling units in operation, and power usage), with the differences between the predictive information and the sensor results being examined for statistical likelihood versus anomalous behavior. In the event anomalous behavior is determined to be likely, the predictive information and the sensor results can be compared point-for-point to determine a most likely place and time where an anomaly would have occurred, and to determine the nature of the likely anomaly.

In one or more fourth examples related to techniques described above with respect to anomaly detection, the computer system and cooling system can alert one or more users with respect to the nature of the anomaly (and possibly its likely progression, whether for better or for worse), so that those one or more users can fix or replace the parts associated with the anomaly, or possibly to alter operations associated with the computer system and the cooling system (such as to route airflow or cooling around the anomaly), with the effect that the anomaly can be ameliorated, or at a minimum, can be restrained until operations of the computer system and cooling system can be corrected, replaced, rerouted by hand, or reduced in operative capacity.

In further examples related to techniques described above with respect to anomaly detection, the computer system and cooling system can make further comparisons between actual sensor results from the computer system and the cooling system, and can attempt to locate an origin of the anomaly. For example, the computer system can use a machine learning technique or neural network to determine a most likely point of error (or a probability density of points of error) for an origin of the anomaly.

This Application.

After reading this application, those skilled in the art would recognize that techniques shown in this application are applicable to more than just the specific embodiments shown herein. For a first example, the concept of machine learning is intended to be broad, and can include other forms of machine learning, which known or not yet known at the current time. For a second example, the concept of electrochemical and/or electromechanical systems is intended to be broad, and can include any such system involving a user and/or feedback control, such as analgesic delivery systems, automated stock trading systems, computer network error detection and/or routing, computer processor branch and/or fault prediction, missile control systems, radiochemical cancer treatments, refineries, robotic systems, self-driving vehicles, vehicle engine control systems, and combinations or conjunctions thereof.

While multiple embodiments are disclosed, including variations thereof, still other embodiments of the present application will become apparent to those skilled in the art from the following detailed description, which shows and describes illustrative embodiments of the application. The application is capable of modifications in various aspects, all without departing from its scope or spirit. The drawings and detailed description are illustrative in nature and not restrictive.

BRIEF DESCRIPTION OF THE FIGURES

FIG. 1 shows a conceptual drawing of a system.
FIG. 2 shows a conceptual drawing of a method.

DETAILED DESCRIPTION OF AN EMBODIMENT

Terms and Phrases

The following definitions are intended to be exemplary and illustrative, not necessarily limiting in any way:

The term "confidence," and variants thereof, generally refer to a degree of certainty in the results of an empirical model, and the control of uncertainty associated with a prediction.

The term "correlation," and variants thereof, generally refer to a tendency of two data points to change together. Positively correlated data points increase and decrease together. Negatively correlated data points increase in contrary motion; when one increases, the other decreases. Uncorrelated data points do not change together; when one point increases, the other may stay constant, or increase or decrease. There are also different types of correlation to be considered: for example, there could be "static" (sometimes referred to as "absolute") correlation between pairs of distinct data points, and there could be "dynamic" correlation (sometimes referred to as "autocorrelation") between distinct forecasts for data points.

The phrase "empirical model," and variants thereof, generally refer to any relation between data points, discovered at least in part, in response to measured observations in the past. Empirical models could be distinguished from "computational models," "process-based models," and variants thereof, such as those models based on fluid dynamics, such as CFD (computational fluid dynamics), in which the which the relation between data points is in response to a physical model imposed by an understanding temperature dissipation and possibly other factors.

The term "forecasting," and variants thereof, generally refer to estimating future values of a data point in response to observations in the past or present of the same or similar data points (such as expected IT power usage in response to IT power usage in the past 72 hours).

The phrase "machine learning," and variants thereof, generally refer to software systems that automatically recognize patterns between distinct data points, or patterns for an individual data point over time, from measured data. In some (not necessarily all) embodiments, a system including ML, or involving ML techniques, can apply discovered or recognized patterns in an effort to forecast (in whole or in part) future values of those or other data points.

The term "predicting," and variants thereof, generally refer to estimating specific data points in response to observations of other data points from the same or similar (such as nearby) time frames (such as valve positions in response to temperatures).

After reading this application, those skilled in the art would recognize that these terms and phrases can be broadly construed, and that the scope and spirit of the invention is not limited thereby.

FIGURES AND TEXT

FIG. 1 shows a conceptual drawing of a system.
FIG. 2 shows a conceptual drawing of a method.

SYSTEM OVERVIEW

FIG. 1 shows a conceptual drawing of a system.

A system 100 includes elements described herein, other elements shown in the figure, and possibly other elements. In one embodiment, the system 100 includes two or more redundant nodes; however, the figure only shows one of those nodes. This one of multiple nodes is also in communication with those other nodes, with the effect of providing a reliable distributed computer system. As the multiple nodes frequently communicate the content of their memory and storage devices, the system 100 can be are stored.

Predictive Analytics

A predictive analytics system 100 can include at least a first virtual machine (VM), labeled VM1 111, operationally coupled to and capable of receiving data from a data center 120, or other source of electrochemical or electromechanical information. In one embodiment, the VM1 111 is operationally coupled to, and capable of receiving from the data center 120, a sequence of specific data points (such as pressure at specific sensors, temperature at specific sensors, valve positions and airflow at specific sensors, hourly or other updates of the sensed values at those specific sensors, tuning parameters, and possibly other information).

In one embodiment, VM1 111 could be configured to execute a Microsoft guest operating system (OS) itself configured to control an SQL-accessible database and an object/database schema. In one embodiment, the object/database schema in VM1 111 is compatible with an identical or similar SQL-accessible database and object/database schema disposed and operable at the data center 120.

In one embodiment, the predictive analytics system 100 can include at least a second VM, labeled VM2 112, operationally coupled to and capable of presenting information or other data to the data center 120, such as either by (A) email messages with PDF attachments, (B) one or more web interfaces, using one or more web protocols such as HTTP, HTTPS, or variants thereof, and combinations or conjunctions thereof. In one embodiment, the VM2 112 could be configured to execute an Ubuntu 12.04 guest OS, itself configured to control an R server, and in one embodiment operationally coupled to the data center 120, with the latter operationally coupled to receive information from the data presentation element VM2 112.

The VM's VM1 111 and VM2 112 could be operationally coupled using an ODBC interface, with the effect that VM2 112 could receive database elements and related information from VM1 111, within the predictive analytics system 100.

The predictive analytics system 100 can include a graphical user interface (GUI) 113, or other interface, capable of interfacing with one or more users. This has the effect that those one or more users can issue commands and receive responses from the predictive analytics system 100.

The predictive analytics system 100 can also include an interface with a weather forecast element 130, and possibly other external information, as described herein, that can be received and used by the VM2 112. Having received (in one embodiment) hourly data points from the data center 120, the VM1 111 is capable of organizing those data points in a database, and supplying that information to VM2 112. Having received those hourly data points in predictive units (themselves divided into a first 72 hours of input data and a second 24 hours of output data), and with those predictive units divided into two classes: "model-building" and "model-calibration" units, as described herein.

Predictive Analytics

The VM2 112 can include a control system that receives the data points (from the data center 120), weather forecast (from the weather forecast element 130), and possibly other external information, and can construct a set of prediction rules, as described herein. Once the prediction models have been created (that is, the prediction rules have been "learned"), the control system can make predictions of future data points in response to known data points. These predictions of future data points can be presented to one or more users by means of the data center 120, and can be exchanged with one or more users by means of the GUI 113.

Method of Operation

FIG. 2 shows a conceptual drawing of a method.

A method 200 includes flow points and method steps as described herein. These flow points and method steps are, by the nature of the written word, described in a particular order. This description does not limit the method to this particular order. They might be performed in a different order, or concurrently, or partially concurrently, or otherwise in a parallel, pipelined, quasi-parallel, or other manner. They might be performed in part, paused, and returned to for completion. They might be performed as co-routines or otherwise. In the context of the invention, there is no particular reason for any such limitation.

One or more portions of the method 200 are sometimes described as being performed by particular elements of the system 10o described with respect to FIG. 1, or sometimes by "the method" itself. When a flow point or method step is described as being performed by "the method," it can be performed by one or more of those elements, by one or more portions of those elements, by an element not described with respect to the figure, by a combination or conjunction thereof, or otherwise.

Beginning of Method

A flow point 200A indicates a beginning of the method.

Data Points.

In one embodiment, the method 200 operates on a set of input data. The input data can include a set of input data representing a set of physical values with respect to a computer system and cooling system, such as including one or more of: computer system usage data, data point variance between time measurements, data point variance from measured at distinct times, dew point (as calculated from raw data), fan speeds, temperature sensors, valve positions of cooling units, metadata (such as location and time of measurement for data points), and combinations or conjunctions thereof. The input data can also include additional values, used in "tuning" the model, which can be set during calibration of the model.

In one embodiment, the method 200 can use three days of input data to predict a single day of output data. Thus, with one data point taken for each hour, 72 data points can be used for input to the prediction model, while 24 data points can be used as output from the prediction model. If one data point were to be taken for each minute, there would be 60 times as many input data points to the prediction model. While this application is primarily described with respect to data points being measured and predicted at hourly increments, in one embodiment, there is no particular requirement for any such limitation. For example, data points could be taken for each three minutes and used as output from the prediction model for each six minutes.

In one embodiment, the method 200 can use input data points without any particular assignment of priority or weights assigned to any particular input data point. For example, in some known systems, predictions are made in response to data points that are weighted a greater amount for relatively more recent data observations than for relatively earlier observations; however, in one embodiment, the degree of calibration or weighting can be discovered by the machine learning (ML) procedure itself, without any particular requirement for priority or weights to be assigned ahead of time.

"Ensemble of Random Trees" Model.

In one embodiment, an ML technique such as an "ensemble of random trees" model (sometimes referred to as an "ensemble of decision trees"), can be used to determine an output prediction of data point values, in response to input data point values. In such "ensemble of random trees" models, the ML technique can generate a very large number of randomly or pseudo-randomly constructed decision trees, each of which is characterized by a decision, at each node, of which subtree to examine in response to a data point value. In one embodiment, the decision, at each node, can be responsive to a "critical threshold" or a "tuning value," which is determined to be most likely to affect the predicted output data point value. For example, if a particular random tree has a node at which the data point value for $t_{-2\ hours}$ is most likely to affect the output value for the data point 24 hours later, that value for $t_{-2\ hours}$ would be used to select among one or more subtrees to the individual tree in the ensemble of random trees. As described herein, tuning values can include parameters that are used by the model to assist in predicting future data point values in response to past data point values.

While this application is primarily described with respect to an "ensemble of random trees" ML technique, those skilled in the art would recognize, after reading this application, that other and further ML techniques could also be suitable, and could be substituted (with appropriate modification) for the "ensemble of random trees" ML technique as described herein. For example, artificial neural networks (including "deep learning" techniques), support vector machines, and variations on k-nearest-neighbor (kNN) techniques (while accounting for difficulties sometimes associated with application of kNN techniques in $R''$).

Model Training and Calibration

A flow point 210 indicates that the method 200 is ready to begin model training and calibration.

Collect Data Points.

At a step 221, the method 200 initiates a program or script, such as an R script, to collect data points into predictive units. In one embodiment, the method 200 collects the set of data points into sequences of 96 hours, 72 hours of "input" data points and 24 hours of "output" data points. Thus, each such sequence includes four days of data points, three of which are used to make predictions, and the final one of which is used to test those predictions, sometimes referred to respectively as "input data points" (the first 72 hours) "output data points" (the final 24 hours), and as one or more "predictive units" (the entire 96 hours considered as a unit). The method 200 can collect these predictive units using an OODBMS (object-oriented database management system), SQL (structured query language), or some other database inquiry technique. While in this application an embodiment is primarily described with respect to a ratio of 3:1 (three input data points to one output data point), In the context of the invention, there is no particular requirement for any such particular limitation.

In one embodiment, the method 200 adds, to the predictive units, metadata representing human relations to time (such as: time of day, day of week, day of month, day of year, week of month, week of quarter, month of quarter, month of year, a.m. or p.m., weekday or weekend, holiday or not, and otherwise) to each data point. In one embodiment, the method 200 also adds, to the predictive units, metadata representing external variables that might have an effect on the heating or cooling environment (such as: current weather and weather forecasts, how many troops are on active duty, road construction, school calendars, sports calendars, stock market data, whether or not Congress is in session, whether the federal government is closed for lack of a budget, and otherwise) to each data point. These external variables allow the model to determine whether an exogenous event, such as a World Series baseball game, could led to increased heat reflection, parking, power usage, smog, and combinations or conjunctions thereof.

Model Training

At a step 222, the method 200 separates the predictive units into two types, "model-building" units and "model-calibration" units. In one embodiment, the method 200 selects the predictive units completely at random (or in response to a pseudo-random effect), with the effect that those predictive units selected for model-building can be interspersed at random with those predictive units selected for model-calibration. In one embodiment, those predictive units selected for model-building need not be sequential, nor need they bear any particular relationship with respect thereto. Similarly, in one embodiment, those predictive units selected for model-calibration need not be sequential, nor need they bear any particular relationship with respect thereto. For example, predictive units could be selected for model-building and model-calibration in response to the binary expansion of e or π (without replacement), but those would not necessarily be random.

In one embodiment, as part of this step, predictive units, or sets of input data or output data within predictive units, could (optionally) be assigned a set of weightings, to be used to determine how important that predictive unit, or set of data elements within a predictive unit, should be considered when attempting to predict a future value in the predictive unit. For example, weighting of data could be linearly reduced with time, from a full value to a negligible or zero value. Similarly, weighting of data could be decreased by a power-law decrease (such as a Pareto "80/20" distribution), an exponential decrease, or some other form of decrease (such as possibly one that is responsive to values of other variables). However, in the context of the invention, there is no particular requirement for any of these limitations. The ML technique as described herein, as well as other ML techniques that are known, would be able to determine a set of data weightings in response to those ML techniques.

In one embodiment, as part of this step, the method 200 selects predictive units (without replacement) for model-building with a probability of about ⅔ and selects predictive units (without replacement) for model-calibration with a probability of about ⅓. However, after reading this application, those skilled in the art would recognize that in the context of the invention, there is no particular requirement for any such limitation. For example, there is no particular requirement that the predictive units selected for model-building and model-calibration are necessarily ⅔ and ⅓ of the predictive units respectively; they could be ¾ and ¼ of the predictive units respectively. The fractions ⅔ and ⅓ are a statistical rule of thumb that has been known to work in other statistical models.

Parameter Adjustment.

At a step 223, the method 200 adjusts the parameters on the model-building units so as to operate on the input values to the predictive model, to produce the output values from the predictive model, at least with respect to the model-building units. As part of this step, the method 200 selects a first set of parameters, with the effect that application of that first set of parameters to the input values to the predictive model produces values (for each model-building unit) as close as practical to the output values associated with those model-building units.

In one embodiment, as part of this step, the method 200 also adjusts tuning parameters, along with the ordinary parameters associated with the ML technique, so as to match the results of the model-building units with the model-calibration units. These tuning parameters could, for example, include a degree of tradeoff between acceptable complexity and acceptable error. For example, it is possible to over-fit the tuning parameters, with the positive effect that the results of applying the ML technique to the input values of the model-building units produces values very close to the output values of the model-building units, but with the negative effect that the results of applying the ML technique to the input values of the model-calibration units produces values that are not well-correlated with the output values of the model-calibration units.

Determine Tuning Error.

At a step 224, the method 200 determines a tuning error associated with each separate model of decision trees. In one embodiment, the tuning parameter could be set so that the tuning error is substantially equal to a lowest mean square error associated with the predictions made by the model. For example, if the model is relatively under fit, the mean square error will be higher than a minimal value, while if the model is relatively over fit, the mean square error will also be higher than a minimal value. In general, the mean square error will be minimal for the data if the model is neither under-fit nor over-fit, that is, if the model is relatively best-fit to the data.

Check Tuning Error.

At a step 225, the method 200 determines whether the tuning error is adequate for its purposes. If not, the method 200 returns to the earlier step 222. Otherwise, the method 200 proceeds with the flow point 230.

Tuning Parameters

A flow point 230 indicates that the method 200 is ready to analyze input data using one or more models.

Gather Actual Data.

At a step 241, the method 200 gathers (or updates) actual data and associated metadata for relatively recent data points. That is, since the method 200, as described herein, uses 72 hours of input data points to generate 24 hours of output data points, at this step, the method 200 gathers the 72 most recent hours or more of actual data and associated metadata (which have now possibly advanced by one hour), to predict a new set of 24 next hours of future data.

In one embodiment, the method repeats the just-previous step and the current step for as long as the one or more users desire to continue use.

Gather Actual Data.

At a step 242, the method 200 uses the selected 24 ensembles of random trees, each with its own set of tuning parameters, each on its own set of 72 hours of past data. As noted above, the 72 hours of past data includes both internal information from the computing system and the cooling system, and external information such as human-time metadata, construction, sports events, strike activity, and otherwise. For each of the 24 hours of future data (that is, following the 72 hours of past data), the predictive model presents a predicted output value for each status value in the computing system and cooling system. These predicted output values, as noted above, could include airflow, dew point (calculated from other values), fan speed, pressure, temperature, and otherwise.

Present Predicted Result(s).

At a step 243, the method 200 uses the selected 24 ensembles of random trees, each with its own set of tuning parameters, each on its own set of 72 hours of past data, to determine whether to present an alarm to one or more users, to determine whether or not one or more anomalies exist between the actual sensor data and the predicted data, and otherwise, as described herein.

When the one or more users desire to discontinue use, the method proceeds with the flow point 200B.

Refresh Model-Building.

At a step 244, the method 200 determines if it needs to refresh the model-building steps described earlier with respect to between the flow points 210 and 230. For example, the method 200 could determine that the degree of error associated with the most recent output data points is higher than expected, represents a persistent anomaly, or otherwise indicates that the model should be rebuilt. In one embodiment, the model is rebuilt every instance of a duration of time, for some selected duration of time, such as every 6 hours, regardless of accuracy. However, in the context of the invention, there is no particular requirement for any such limitation; any reasonable duration could be selected.

If the method 200 determines that the model should be rebuilt, the method 200 returns to and repeats the steps following the flow point 210. Otherwise, the method 200 returns to and repeats the steps following the flow point 230.

End of Method

At a flow point 200B, the computing system and the cooling system have been operated by the one or more users, and no further predictions are desired or needed. In one embodiment, the method 200 is halted. In one embodiment, the method 200 is repeated each time any one or more users restarts the method 200.

After reading this application, those skilled in the art would recognize that when the computer system and the cooling system are operational, the method 200 could be restarted, and its predictive analytics can be used to make predictions of sensor values, alert one or more operators, determine anomalies, and otherwise.

ALTERNATIVE EMBODIMENTS

While some embodiments are generally described herein with respect to control of computer systems and associated cooling systems, in the context of the invention, there is no particular requirement for any such limitation. For example, multiple computer systems can be combined with one cooling system, one computer system could be combined with multiple cooling systems, or both, or some combination or conjunction thereof. One or more computer systems could be combined or cooperate as a single computer system. One or more cooling system could be combined or cooperate as a single cooling system. One or more computer systems and cooling systems could be combined or cooperate as multiple computer systems or cooling systems (or multiple combinations of computer systems and cooling systems), which could then be combined or cooperate as a single computer system and cooling system, and combinations or conjunctions thereof. Examples of such combinations or conjunctions thereof could include any system in which electrical power is consumed, with the effect of generating heat, and in which heat energy is moved away from a region in which that heat energy is generated.

As also noted herein, while some embodiments are generally described herein with respect to control of electromechanical systems, such as computer room air conditioners (CRAC's) and other cooling systems, in the context of the invention, there is no particular requirement for any such limitation. For example, relatively complex electrochemical systems, such as chemical and oil refineries, chemical and steel plants, hydroponic plants, vehicle engines, and combinations or conjunctions thereof, are all within the scope and spirit of the invention. Moreover, other predictive systems having feedback or feed-forward control, such as caching and communication systems, insurance and securities trading markets, missile control systems, sports and other prediction markets, and combinations or conjunctions thereof. Examples of such and combinations or conjunctions thereof could include any system in which control of a relatively complex system is responsive to a relatively complex set of control variables.

While some embodiments are generally described herein with respect to transfer of unitary blocks of data, in the context of the invention, there is no particular requirement for any such limitation. For example, individual elements or method steps of the described embodiments could be replaced with substitutes that perform similar functions in other contexts. Examples of such contexts can include any system in which large data transfers are contemplated, such as a system that transfers a collection of multiple data packets (so long as locations of those data packets can be identified).

Elements of the system are described herein with respect to one or more possible embodiments, and are not intended to be limiting in any way. In the context of the invention, there is the particular requirement for any such limitations as described with respect to any elements of the system. For example, individual elements of the described apparatuses could be replaced with substitutes that perform similar functions. Moreover, as described herein, many individual elements of the described apparatuses are optional, and are not required for operation.

Although elements of the one or more described systems are described herein as being executed as if on a single computing device, in the context of the invention, there is no particular requirement for any such limitation. For example, the elements of the one or more described systems can include more than one computing device, not all necessarily similar, on which the element's functions are performed; Alternatively, multiple elements can be included in one such computing device.

Certain aspects of the embodiments described in the present disclosure may be provided as a computer program product, or software, that may include, for example, a computer-readable storage medium or a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular embodiments. Functionality may be separated or combined in procedures differently in various embodiments of the disclosure or described with different terminology. These and other variations, modifications, additions, and improvements may fall within the scope of the disclosure and the inventive subject matter.

The invention claimed is:

1. A method of operating a computer room temperature control facility, including steps of
collecting past data with respect to control settings and sensor readings in a control facility, and maintaining said collected past data into a first database operating on a first control computer;
collecting metadata, external to said control facility, said metadata having an effect on load on said control facility, and maintaining said metadata into a second database operating on a second control computer;
communicating said data from said first control computer to said second control computer;
generating correlated data, in response to said data and said metadata, with respect to at least one time series;
dividing said correlated data into a plurality of training sets, each of said training sets including a sequence of said time series correlated data;
for each of said training sets, dividing said training set into a first portion and a second portion;
for each of said training sets, selecting a set of tuning parameters that provide a model of said second portion in response to said first portion;
collecting present data with respect to said control settings and sensor readings, maintaining said present data in said first database, and communicating said present data from said first control computer to said second control computer;
collecting present metadata, external to said control facility, said present metadata having an effect on load on said control facility, and maintaining said metadata into said second database;
operating said model on said second control computer, and presenting outputs from said model to one or more users at a logically remote facility;
receiving commands from said one or more users with respect to said control facility;
directing, by said second control computer, said control facility to perform steps having effect on its operation, in response to said commands;
collecting new data with respect to said control settings and sensor readings in said control facility, maintaining said new data in said first database, and communicating said new data from said first control computer to said second control computer;
collecting new metadata, external to said control facility, said new metadata having an effect on load on said control facility, and maintaining said new metadata into said second database;
updating said model on said second control computer in response to said new data and said new metadata;
repeating said steps of operating said model; receiving commands; directing said control facility to perform steps; collecting new data; collecting new metadata; and updating said model; until terminated by one or more users.

2. A method as in claim 1, wherein
said model provides confirmation or denial to said users whether said control facility is operating as expected;
wherein said confirmation or denial includes one or more of:
whether any one or more control elements or parts are deviating from expectation;
whether any one or more predicted results are deviating from actual sensor information from the computer system;
whether any one or more predicted results are deviating from actual sensor information from the cooling system; or
whether current measurements are deviating from experience.

3. A method as in claim 1, wherein
said model provides confirmation or denial to said users whether said control facility is operating as expected;
wherein said confirmation or denial includes one or more of:
whether any one or more control elements or parts are deviating from actual sensor information by a statistically meaningful amount,
whether any one or more predicted results are deviating from actual sensor information by a statistically meaningful amount, or
whether current measurements are deviating from experience by a statistically meaningful amount.

4. A method as in claim 1, wherein
said model provides confirmation or denial to said users whether said control facility is operating as expected;
wherein said confirmation or denial includes one or more of:
alerting one or more users with respect to a difference between actual operation and operation as expected, or
alerting one or more users with respect to progress of said difference.

5. A method as in claim 1, wherein
wherein said model provides information to said users with predictions of future computer system load and cooling requirements;
wherein said commands in said steps of receiving include commands directing said control facility to:
adjust an amount of pre-cooling of at least portions of said control facility,
load-balance system use at particular times by transferring tasks between differing computers,
load-balance system use by transferring tasks between differing times, or
load-balance system use by transferring tasks between differing control facilities.

6. A method as in claim 1, wherein
said model provides information to said users with predictions of future computer system load and cooling requirements;
wherein said commands in said steps of receiving include commands directing said control facility to perform one or more of:
adjusting a clock speed of a computer at particular times,
adjusting a fan speed,
adjusting an amount of airflow,
adjusting use of peripheral devices at particular times,
setting a number of computers or peripherals in use to a newly-designated number at particular times,
setting an amount of cooling effort to newly-designated amounts at particular times, or
starting cooling systems at newly-designated times.

7. A method as in claim 1, wherein
wherein said model provides information to said users with respect to a likely degree of effect on the computer system, in response to either proposed changes to interactions between the computer system and the cooling system, or proposed changes to the cooling system itself, wherein said proposed changes include one or more of:
an adjustment in cooling effect,
a prediction or probability that control elements or parts will fail to operate, or will operate only in a degraded manner,
in response to one or more of:
said users adjusting one or more set points at which cooling begins or ends, or
said users determining a degree of redundancy with respect to parts or subsystems.

8. A method as in claim 1, wherein
said steps of operating said model, presenting outputs from said model, and receiving commands to perform one or more steps of:
adjusting routing of airflow or cooling away from an anomaly,
adjusting said control facility to allow said users to repair or replace control elements or parts associated with an anomaly, or
adjusting said control facility to allow said users to correct, replace, reroute, or change in operative capacity, in response to an anomaly.

9. Apparatus for operating a computer room temperature control facility, including
a first database operating on a first control computer, said first database maintaining collected past data with respect to control settings and sensor readings in a control facility;
a second database operating on a second control computer, said second database maintaining collected metadata, external to said control facility, said metadata having an effect on load on said control facility;
a communication link between said first control computer and said second control computer;
said second database maintaining data, correlated in response to said data and said metadata with respect to at least one time series, said correlated data being partitionable into a plurality of training sets, each of said training sets including a sequence of said time series correlated data, each of said training sets, partitionable into a first partition and a second partition;
said second database maintaining a model of said second portion in response to said first portion for each of said training sets;
sensors coupled to new data with respect to said control settings and sensor readings, and coupled to said communication link;
sensors coupled to new metadata having an effect on load on said control facility;
a computer server coupled to said model on said second control computer, and coupled to outputs from said model to one or more users, said server disposed to receive and respond to commands from said one or more users, said commands operating on said control facility;
said server including instructions to repeatedly receive more new data, update said model, and receive and respond to said one or more users.

10. Apparatus as in claim 9, wherein
said model provides confirmation or denial to said users whether said control facility is operating as expected;
wherein said confirmation or denial includes one or more of:
whether any one or more control elements or parts are deviating from expectation,
whether any one or more predicted results are deviating from actual sensor information from the computer system,
whether any one or more predicted results are deviating from actual sensor information from the cooling system, or
whether current measurements are deviating from experience.

11. Apparatus as in claim 9, wherein
said model provides confirmation or denial to said users whether said control facility is operating as expected;
wherein said confirmation or denial includes one or more of:
whether any one or more control elements or parts are deviating from actual sensor information by a statistically meaningful amount,
whether any one or more predicted results are deviating from actual sensor information by a statistically meaningful amount, or
whether current measurements are deviating from experience by a statistically meaningful amount.

12. Apparatus as in claim 9, wherein
said model provides confirmation or denial to said users whether said control facility is operating as expected;
wherein said confirmation or denial includes one or more of:
alerting one or more users with respect to a difference between actual operation and operation as expected, or
alerting one or more users with respect to progress of said difference.

13. Apparatus as in claim 9, wherein
wherein said model provides information to said users with predictions of future computer system load and cooling requirements;
wherein said commands operating on said control facility include commands directing said control facility to:
adjust an amount of pre-cooling of at least portions of said control facility,
load-balance system use at particular times by transferring tasks between differing computers,
load-balance system use by transferring tasks between differing times, or
load-balance system use by transferring tasks between differing control facilities.

14. Apparatus as in claim 9, wherein
said model provides information to said users with predictions of future computer system load and cooling requirements;
wherein said commands operating on said control facility include commands directing said control facility to perform one or more of:
adjusting a clock speed of a computer at particular times,
adjusting a fan speed,
adjusting an amount of airflow,
adjusting use of peripheral devices at particular times,
setting a number of computers or peripherals in use to a newly-designated number at particular times,
setting an amount of cooling effort to newly-designated amounts at particular times, or
starting cooling systems at newly-designated times.

15. Apparatus as in claim 9, wherein
wherein said model provides information to said users with respect to a likely degree of effect on the computer system, in response to either proposed changes to interactions between the computer system and the cooling system, or proposed changes to the cooling system itself, wherein said proposed changes include one or more of:
an adjustment in cooling effect,
a prediction or probability that control elements or parts will fail to operate, or will operate only in a degraded manner,
in response to one or more of:
said users adjusting one or more set points at which cooling begins or ends, or
said users determining a degree of redundancy with respect to parts or subsystems.

16. Apparatus as in claim 9, wherein
said model is disposed to present outputs, and to receive commands including one or more of commands directing the control facility to:
adjust routing of airflow or cooling away from an anomaly,
adjust said control facility to allow said users to repair or replace control elements or parts associated with an anomaly, or
adjust said control facility to allow said users to correct, replace, reroute, or change in operative capacity, in response to an anomaly.

17. A system including non-transitory memory, said memory maintaining instructions interpretable by a computing device said instructions directing a computer room temperature control facility, to perform steps of
collecting past data with respect to control settings and sensor readings in a control facility, and maintaining said collected past data into a first database operating on a first control computer;
collecting metadata, external to said control facility, said metadata having an effect on load on said control facility, and maintaining said metadata into a second database operating on a second control computer;
communicating said data from said first control computer to said second control computer;
generating correlated data, in response to said data and said metadata, with respect to at least one time series;
dividing said correlated data into a plurality of predictive units including model-building units and model-calibration units, each of said predictive units including a sequence of said time series correlated data;
for each of said predictive units, selecting a set of tuning parameters that provide a model of said model-calibration unit in response to said model-building unit;
collecting present data with respect to said control settings and sensor readings, maintaining said present data in said first database, and communicating said present data from said first control computer to said second control computer;
collecting present metadata, external to said control facility, said present metadata having an effect on load on said control facility, and maintaining said metadata into said second database;
operating said model on said second control computer, and presenting outputs from said model to one or more users at a logically remote facility;
receiving commands from said one or more users with respect to said control facility;
directing, by said second control computer, said control facility to perform steps having effect on its operation, in response to said commands;
collecting new data with respect to said control settings and sensor readings, maintaining said new data in said first database, and communicating said new data from said first control computer to said second control computer;
collecting new metadata, external to said control facility, said new metadata having an effect on load on said control facility, and maintaining said new metadata into said second database;
updating said model on said second control computer in response to said new data and said new metadata;
repeating said steps of operating said mode; receiving commands, directing said control facility to perform steps; collecting new data; collecting new metadata; and updating said model; unterminated by one or more users.

* * * * *